United States Patent
Han et al.

(10) Patent No.: US 10,396,755 B2
(45) Date of Patent: Aug. 27, 2019

(54) RESONATOR HAVING FRAME AND METHOD OF MANUFACTURING THE SAME

(71) Applicant: SAMSUNG ELECTRO-MECHANICS CO., LTD., Suwon-si (KR)

(72) Inventors: Sung Han, Suwon-si (KR); Dae Ho Kim, Suwon-si (KR); Ran Hee Shin, Suwon-si (KR); Hwa Sun Lee, Suwon-si (KR); Chang Hyun Lim, Suwon-si (KR); Tae Kyung Lee, Suwon-si (KR); Sung Sun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 290 days.

(21) Appl. No.: 15/271,579

(22) Filed: Sep. 21, 2016

(65) Prior Publication Data

US 2017/0237408 A1    Aug. 17, 2017

(30) Foreign Application Priority Data

Feb. 17, 2016    (KR) .................. 10-2016-0018277

(51) Int. Cl.
| | | |
|---|---|---|
| *H03H 9/17* | (2006.01) | |
| *H03H 3/02* | (2006.01) | |
| *H03H 9/13* | (2006.01) | |
| *H03H 9/54* | (2006.01) | |
| *H03H 9/02* | (2006.01) | |

(52) U.S. Cl.
CPC .............. *H03H 9/17* (2013.01); *H03H 3/02* (2013.01); *H03H 9/02118* (2013.01); *H03H 9/13* (2013.01); *H03H 9/173* (2013.01); *H03H 9/54* (2013.01); *H03H 2003/021* (2013.01)

(58) Field of Classification Search
CPC ........ H03H 9/17; H03H 9/02118; H03H 9/13; H03H 9/179; H03H 9/54
See application file for complete search history.

(56) References Cited

U.S. PATENT DOCUMENTS 6,105,225 A * 8/2000 Torii .................. G01P 15/0802
                                              29/25.35
6,396,200 B2    5/2002 Misu et al.
(Continued)

FOREIGN PATENT DOCUMENTS

JP           5246454 B2     7/2013
KR    10-2008-0015632 A     2/2008
(Continued)

OTHER PUBLICATIONS

Korean Office Action dated Dec. 19, 2016 in corresponding Korean patent application No. 10-2016-0018277 (11 Pages with English translation).

*Primary Examiner* — J. San Martin
(74) *Attorney, Agent, or Firm* — NSIP Law

(57) ABSTRACT

A resonator includes a resonating portion including a first electrode, a second electrode, and a piezoelectric layer positioned between the first electrode and the second electrode; and a frame provided at an outer edge of the resonating portion, at least a portion of the frame covering an outer end portion of the second electrode.

14 Claims, 3 Drawing Sheets

(56) References Cited

U.S. PATENT DOCUMENTS

| | | | | |
|---|---|---|---|---|
| 7,924,120 B2* | 4/2011 | Umeda | ............... | H03H 9/02102 |
| | | | | 333/187 |
| 8,230,562 B2* | 7/2012 | Fazzio | ............... | H03H 9/02149 |
| | | | | 29/25.35 |
| 8,342,660 B2* | 1/2013 | Nakayama | ............ | B41J 2/14233 |
| | | | | 29/890.1 |
| 8,456,257 B1* | 6/2013 | Fattinger | ............ | H03H 9/02086 |
| | | | | 310/312 |
| 8,791,776 B2* | 7/2014 | Pang | ................. | H03H 9/02086 |
| | | | | 310/312 |
| 9,148,117 B2* | 9/2015 | Burak | ...................... | H03H 3/04 |
| 9,842,980 B2* | 12/2017 | Park | ...................... | H01L 41/047 |
| 2006/0170520 A1 | 8/2006 | Ha et al. | | |
| 2007/0278899 A1* | 12/2007 | Fujii | ................. | H03H 9/02133 |
| | | | | 310/324 |
| 2008/0042780 A1* | 2/2008 | Lee | ......................... | H03H 3/02 |
| | | | | 333/187 |
| 2011/0298564 A1 | 12/2011 | Iwashita et al. | | |
| 2014/0203686 A1 | 7/2014 | Song et al. | | |

FOREIGN PATENT DOCUMENTS

| | | |
|---|---|---|
| KR | 10-2011-0005232 A | 1/2011 |
| KR | 10-2014-0094283 A | 7/2014 |
| WO | WO 2009/132011 A2 | 10/2009 |

\* cited by examiner

RESONATOR HAVING FRAME AND METHOD OF MANUFACTURING THE SAME

CROSS-REFERENCE TO RELATED APPLICATION(S)

This application claims benefit under 35 USC 119(a) of priority to Korean Patent Application No. 10-2016-0018277 filed on Feb. 17, 2016 in the Korean Intellectual Property Office, the entire disclosure of which is incorporated herein by reference for all purposes.

BACKGROUND

1. Field

The detailed description relates to a resonator having a rim-type frame and a method of manufacturing the same.

2. Description of Related Art

Bulk acoustic wave (BAW) resonators (BAWR) generating resonance using acoustic waves in a thickness or depth direction of a substrate are commonly known. Such BAW resonators have a configuration in which electrodes having relatively high acoustic impedance are disposed on both sides of a piezoelectric layer interposed therebetween.

In BAW resonators, acoustic waves in a width direction, as well as acoustic waves in a thickness direction, are generated according to piezoelectric layer characteristics, by which loss occurs to reduce a quality factor (QF).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to a general aspect, a resonator includes a resonating portion including a first electrode, a second electrode, and a piezoelectric layer positioned between the first electrode and the second electrode; and a frame provided at an outer edge of the resonating portion, a portion of the frame covering an outer end portion of the second electrode.

The resonator may further include a substrate positioned to oppose the frame provided on the resonating portion, wherein an air gap is formed between the substrate and the resonating portion.

A membrane layer may be positioned between the substrate and the resonating portion.

The outer end portion of the second electrode may be embedded between the frame and the piezoelectric layer without being externally exposed.

The frame may be formed using the same material as a material of the piezoelectric layer.

The frame may be formed using a metal different from a material of the second electrode.

A material of the frame may have a higher etching selectivity than etching selectivity of a material of the second electrode.

According to another general aspect, a method of manufacturing a resonator includes laminating a first electrode and a piezoelectric layer; laminating a second electrode on the piezoelectric layer; and forming a frame layer on the second electrode, wherein the second electrode is embedded between the frame layer and the piezoelectric layer.

The second electrode may not be formed on a portion of an upper region of the piezoelectric layer, on which a frame is to be formed.

The method may further include forming a mask layer along an outer edge of the frame layer, to be provided on the frame layer; etching a portion of the frame layer; and removing the mask layer.

The method may further include: configuring a material of the frame layer to have a higher etching selectivity than the mask layer; and, forming the frame layer of the same material as a material of the piezoelectric layer.

The method may further include configuring a material of the frame layer to have a higher etching selectivity than the mask layer and the second electrode; and, forming the frame layer of a material different from a material of the piezoelectric layer.

The second electrode may be established to serve as an etch stop layer.

The second electrode may be embedded between the frame layer and the piezoelectric layer.

The frame layer may be formed to cover an outer end portion of the second electrode.

The frame layer may be formed on the second electrode and the piezoelectric layer.

According to another general aspect, a resonator includes a piezoelectric layer; an electrode positioned on the piezoelectric layer; and, a frame extending from the piezoelectric layer to capture a peripheral end portion of the electrode.

A portion of the electrode may be retained between the frame and the piezoelectric layer.

An outer periphery of the electrode may be secured against the piezoelectric layer by the frame, wherein the frame slopes downwards to the electrode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
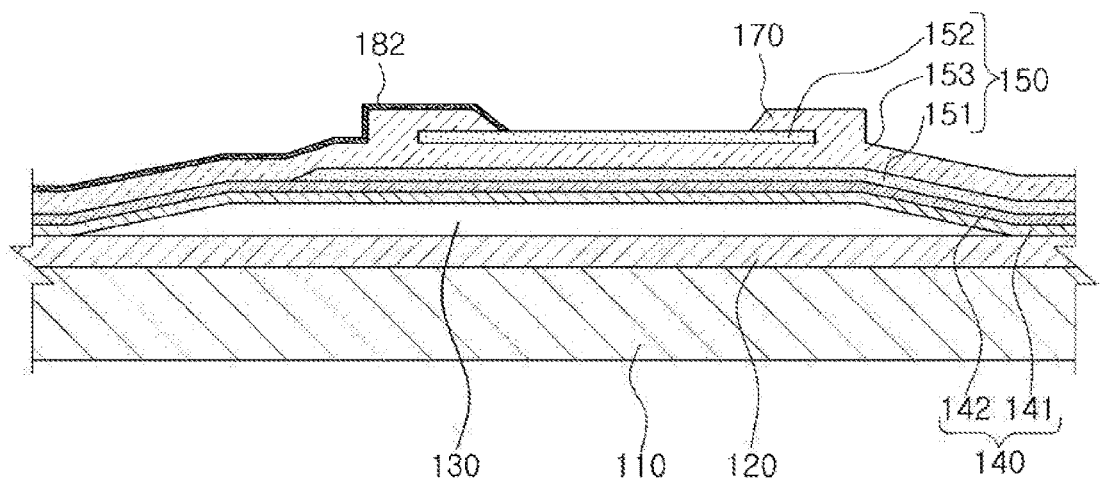
FIG. 1 is a schematic cross-sectional view of a resonator according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" than the other elements or features. Thus, the term "above" can encompass both above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the description is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments will be described with reference to schematic views. In the drawings, for example, due to manufacturing techniques and/or tolerances, modifications of the shape shown may be estimated. Thus, embodiments should not be construed as being limited to the particular shapes of regions shown herein but should be understood, for example, to include a change in shape resulting from manufacturing. The following embodiments may also be constituted by one or a combination thereof.

The contents described below may have a variety of configurations but are not limited thereto.

In order to prevent a reduction in a quality factor (QF), in general, a frame is provided on end portions of a resonator, to reduce insertion loss and significantly increase QF, such that the performance of a resonator, in accordance with an embodiment, may be improved.

As a method of forming a frame on such a resonator, a lift off method may be used, for example. A photoresist, for example, is formed on a piezoelectric layer in an undercut form while performing patterning for the formation of a frame. Thereafter, a frame is deposited using a sputtering method or an electron beam evaporation method, providing a high degree of linearity, and then, the photoresist is delaminated therefrom, thereby forming a frame.

However, in the case that frames are formed on resonators using such a lift off method, precisely implementing linear characteristics or critical dimensions of frames is difficult. Further, residuals such as ring-shaped protrusions may remain after the delamination of a photoresist.

FIG. 1 is a schematic cross-sectional view of a resonator according to an embodiment.

As illustrated in FIG. 1, a resonator, according to an embodiment, includes a resonating portion 150 including a first electrode 151, a second electrode 152, and a piezoelectric layer 153 disposed between the first electrode 151 and the second electrode 152; and a frame 170 provided at an outer edge of the resonating portion 150. At least a portion of the frame 170 covers an outer end, or peripheral, portion of the second electrode 152.

With reference to FIG. 1, a resonator, according to an embodiment, further includes a substrate 110 disposed to oppose the frame 170 provided on the resonating portion 150. In other words, the substrate 120 and frame 170 sandwich the resonating portion 150 therebetween.

The substrate 110 is provided as a silicon substrate or a silicon-on-insulator (SOI) type substrate.

An air gap 130 is formed between the substrate 110 and the resonating portion 150. A membrane layer 140 is interposed between the resonating portion 150 and the substrate 110.

As such, the air gap 130 is formed between the substrate 110 and the membrane layer 140. Through the air gap 130, at least a portion of the membrane layer 140 is spaced apart from the substrate 110.

Because the resonating portion 150 is formed on the membrane layer 140, the resonating portion 150 is also spaced apart from the substrate 110 through the air gap 130.

As the air gap 130 is formed between the substrate 110 and the membrane layer 140, acoustic waves generated in the piezoelectric layer 153 are not influenced by the substrate.

In addition, reflective characteristics of acoustic waves generated in the resonating portion 150 are improved through the air gap 130.

The air gap 130 is a vacant space in which impedance approximates infinity, and thus, acoustic waves remain in the resonating portion 150 without loss.

Thus, the loss of acoustic waves in a thickness direction are significantly reduced through the air gap 130, and a quality factor of the resonating portion 150 is improved.

The membrane layer 140 is disposed on an upper portion of the air gap 130 to maintain a shape of the air gap and to serve to support a structure of the resonating portion 150.

The membrane layer 140 is formed using $SiO_2$ or other suitable material.

As described below, the membrane layer 140 is configured of a plurality of membranes to serve as an etch stop layer in forming the air gap 130 by etching a sacrificial layer.

For example, as illustrated in FIG. 1, the membrane layer 140 includes a first membrane 141 formed of, for example, SiO$_2$, and a second membrane 142 formed of, for example, SiN$_x$ or other suitable material, and disposed on the first membrane 141.

In order to protect the substrate 110, a stopping layer 120 serving as an etch stop layer is also formed on the substrate 110. The stopping layer includes SiO$_x$, SiN$_x$, or other suitable material.

The resonating portion 150 includes the first electrode 151, the second electrode 152, and the piezoelectric layer 153 as described above. The resonating portion 150 is formed by sequentially laminating the first electrode, the piezoelectric layer, and the second electrode from a lower portion.

Thus, the piezoelectric layer 153 is disposed between the first electrode 151 and the second electrode 152.

For example, when the resonating layer 150 is formed on the membrane layer 140, the membrane layer 140, the first electrode 151, the piezoelectric layer 153, and the second electrode 152 are sequentially laminated above the substrate 110.

The resonating portion 150 generates a resonant frequency and an antiresonant frequency by resonating the piezoelectric layer 153 according to signals applied to the first electrode 151 and the second electrode 152.

The first electrode 151 is formed using a metal, such as, gold (Au), molybdenum (Mo), ruthenium (Ru), aluminum (Al), platinum (Pt), titanium (Ti), tungsten (W), palladium (Pd), chromium (Cr), nickel (Ni), or other suitable conductive material.

The second electrode 152 is formed of a metal, such as, chromium (Cr), nickel (Ni), tantalum (Ta), ruthenium (Ru), or other suitable metal, or formed of a material such as tantalum nitride (TaN), titanium nitride (TiN), or other suitable material.

The resonating portion 150 uses acoustic waves of the piezoelectric layer 153. For example, when a signal is applied to the first electrode 151 and the second electrode 152, mechanical vibrations are generated in a thickness direction of the piezoelectric layer so that acoustic waves are generated.

In this case, as a material of the piezoelectric layer 153, such as, ZnO, AlN, SiO$_2$, or the like may be used.

A resonant effect of the piezoelectric layer 153 occurs when an applied signal is generated to have a wavelength approximately 2 times a thickness of the piezoelectric layer. The piezoelectric layer 153 may be formed to have a thickness equal to ½ the desired resonance wavelength.

When the resonant effect occurs, because electrical impedance is rapidly changed, a resonator according to an embodiment is used as a filter configurable for selecting a particular frequency band (or frequency bands) for passing or attenuating.

The first electrode 151 is extended externally from the resonating portion 150, and the extended portion of the first electrode 151 is connected to a first connection portion (not shown).

In addition, the second electrode 152 is connected to a second connection portion 182.

The first connection portion and the second connection portion 182 are provided to confirm resonator characteristics and perform frequency trimming therefor, but are not limited thereto.

The frame 170 is disposed on an upper portion of the resonating portion 150.

The frame 170 is formed to have a ring or rim form formed at or overlapping an outer peripheral edge of the resonating portion 150, but is not limited thereto. The frame 170 may be formed, as another example, as a plurality of arcs.

In the case of the resonator according to an embodiment, the frame 170 is formed in such a manner that at least a portion of the frame 170 covers an outer end portion of the second electrode 152. Thus, the outer end portion of the second electrode 152 is embedded between the frame 170 and the piezoelectric layer 153 without being externally exposed.

The resonator according to an embodiment reflects acoustic waves in a width (horizontal) direction, toward the outside of the resonating portion 150, inwardly of the resonating portion using the frame 170, to thus prevent loss of energy of acoustic waves.

Because the frame 170 serves to reduce loss of energy, the resonator according to an embodiment secures a relatively high quality factor and kt2 (Electro-mechanical Coupling Coefficient) value.

The relatively high quality factor increases blocking characteristics in a different frequency band in the case that the resonator according to an embodiment is used as a filter, a duplexer, or the like. A relatively high kt2 value secures a bandwidth, to increase a data transmission amount and rate at the time of performing transmission and reception.

The frame 170, according to an embodiment, is formed of a piezoelectric material, a dielectric material, a metal, or other suitable material. For example, the frame 170 is formed using any one or any combination of AlN, SiO$_2$, TiO$_2$, gold (Au), molybdenum (Mo), ruthenium (Ru), titanium (Ti), copper (Cu), tungsten (W), and aluminum (Al), or using a synthesized material in which any one thereof is used as a principal ingredient.

The frame 170, according to an embodiment, is formed of the same material as that of the piezoelectric layer 153, but is not limited thereto.

However, in the case of the resonator, according to an embodiment, the frame 170 is formed by depositing a frame layer using an electron beam evaporation method or a sputtering method and then removing a portion therefrom using an etching process. In a case in which the frame 170 is formed of a material different from that of the piezoelectric layer 153, for example, formed of a metal, the frame 170 is formed of a metal different from the second electrode 152. In detail, as a material of the frame 170, a material having sufficiently high etching selectivity, as compared to a material of the second electrode, is used.

For example, when the frame 170 is formed of molybdenum (Mo), the second electrode 152 is formed of chromium (Cr).

Hereinafter, a method of manufacturing a resonator according to an embodiment is described.

First, a stopping layer 120 is formed on a substrate 110.

The stopping layer 120 serves to protect the substrate 110 when a sacrificial layer (not shown) is removed to form an air gap 130.

The stopping layer 120 is formed of SiO$_x$, SiN$_x$, or other suitable material, but is not limited thereto.

Next, the sacrificial layer is formed on the stopping layer 120. As a material of the sacrificial layer, polysilicon, a polymer, or the like may be used.

The sacrificial layer is to be removed using an etching process performed later, to form the air gap 130.

Subsequently, a membrane layer 140 is formed on an upper portion of the sacrificial layer.

In order to form the membrane layer 140, for example, a method suitable therefor, among deposition methods of a chemical vapor deposition (CVD) method, a sputtering method, and the like, are selectively used according to a material for forming the membrane layer 140.

For example, the membrane layer 140 is formed by forming a first membrane 141 formed of, for example, $SiO_2$ or the like, and then, forming a second membrane 142 formed of, for example, $SiN_x$ or the like, on the first membrane 141.

Then, a first electrode 151 and a piezoelectric layer 153 are sequentially formed on the membrane layer 140.

FIGS. 2 to 8 are views sequentially illustrating portions of processes of a method of manufacturing a resonator according to an embodiment.

Figure 2:
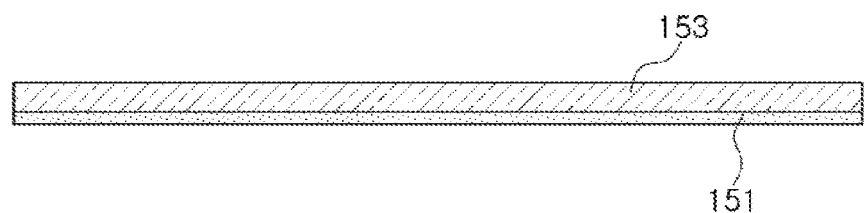
FIGS. 2 to 8 are views sequentially illustrating portions of processes of a method of manufacturing a resonator according to an embodiment.

As illustrated in FIG. 2, the first electrode 151 is formed by depositing a conductive layer on an upper portion of the membrane layer 140 (see FIG. 1) and then removing a portion therefrom through, for example, patterning.

In addition, the piezoelectric layer 153 is formed by depositing a piezoelectric material on the first electrode 151.

In an embodiment, the first electrode 151 is formed using molybdenum (Mo), but is not limited thereto. For example, as a material of the first electrode 151, various types of metal such as gold (Au), ruthenium (Ru), aluminum (Al), platinum (Pt), titanium (Ti), tungsten (W), palladium (Pd), chromium (Cr), nickel (Ni), are used.

In an embodiment, the piezoelectric layer 153 is formed of AlN, but is not limited thereto. For example, as a material of the piezoelectric layer 153, various types of piezoelectric materials such as ZnO, $SiO_2$, and the like are employed.

Figure 3:
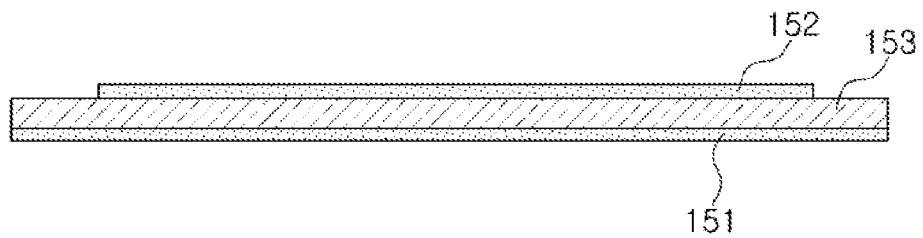

As illustrated in FIG. 3, a second electrode 152 is formed on the piezoelectric layer 153.

The second electrode 152 is formed by forming a conductive layer on the piezoelectric layer 153, depositing a photoresist on the conductive layer to be patterned through a photolithography process, and forming the conductive pattern using the patterned photoresist as a mask.

On a portion of an upper region of the piezoelectric layer 153, on which the frame 170 is to be formed, the conductive layer for formation of the second electrode 152 is not formed.

In an embodiment, the second electrode 152 is formed of chromium (Cr), but is not limited thereto. For example, as a material of the second electrode 152, a metal such as nickel (Ni), tantalum (Ta), ruthenium (Ru), or the like, or a material such as tantalum nitride (TaN), titanium nitride (TiN), or other suitable material is used.

Figure 4:
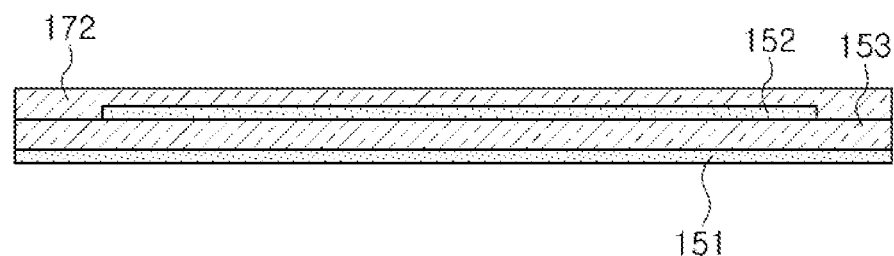

Subsequently, in order to form the frame 170, a frame layer 172 is formed on the piezoelectric layer 153 and the second electrode 152 as illustrated in FIG. 4. The frame layer, according to an embodiment, is deposited using an electron beam evaporation method or a sputtering method.

The frame layer 172 is formed to have a predetermined height, for example, by continuously depositing a piezoelectric material, a dielectric material, a metal, or other suitable material to serve as the frame, and the second electrode 152 is thereby embedded between the frame layer 172 and the piezoelectric layer 153.

For example, the frame layer 172 is formed using any one or any combination of AlN, $SiO_2$, $TiO_2$, gold (Au), molybdenum (Mo), ruthenium (Ru), titanium (Ti), copper (Cu), tungsten (W), and aluminum (Al), or using a synthesized material in which any one thereof is used as a principal ingredient.

Figure 5:
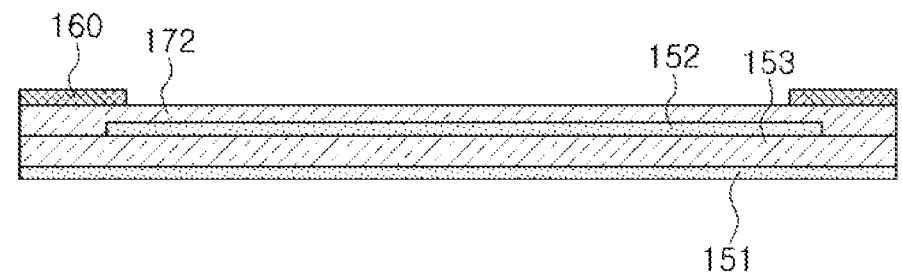

In the case of the frame layer 172 formed as above, for example, a mask layer 160 such as a hard mask is formed on a region of the frame layer 172, substantially corresponding to a width of the frame, as illustrated in FIG. 5.

The mask layer 160 is formed by, for example, depositing a metal such as chromium (Cr), tantalum (Ta), ruthenium (Ru), or other suitable metal, or a material such as $SiN_x$, TaN, TiN, or other suitable material, to then be patterned.

Figure 6:
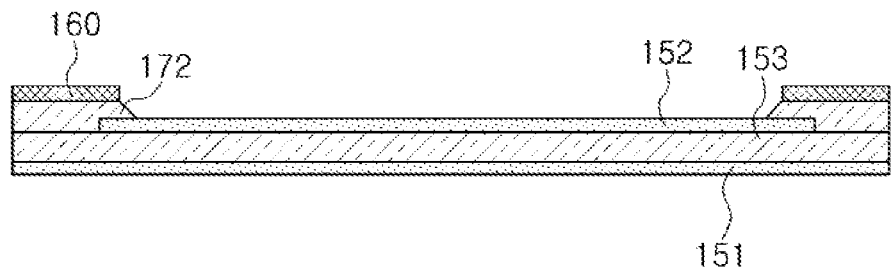

Next, as illustrated in FIG. 6, only a portion of the frame layer 172 is removed therefrom through an etching process.

In this case, as an etchant, a solution or gas capable of etching a material of the frame layer 172 is used.

When the frame layer 172 is formed of the same material as the material of the piezoelectric layer 153, for example, a piezoelectric material, a material of the frame layer 172 having a higher etching selectivity than that of a material of the mask layer 160 is selected, thereby etching a portion of the frame layer to allow the second electrode 152 to be exposed without damage to the mask layer.

The second electrode 152 serves as an etch stop layer. A material of the second electrode 152 is a metal, to thus provide a smooth surface without residuals thereon.

Alternatively, when the frame layer 172 is formed of a material different from a material of the piezoelectric layer 153, for example, formed of a metal, a material of the frame layer 172 having sufficiently high etching selectivity, as compared to materials of the mask layer 160 and the second electrode 152, is selected, thereby etching a portion of the frame layer to allow the second electrode 152 to be exposed without damage to the mask layer and the second electrode.

In this case, the second electrode 152 serves as an etch stop layer. The second electrode 152 is formed of a metal having etching selectivity different from that of a material of the frame layer 172, to thus exhibit a smooth surface without residuals thereon.

For example, the frame layer 172 of frame 170 is formed of molybdenum (Mo), the mask layer 160 is formed of tantalum (Ta) and the second electrode 152 is formed of chromium (Cr).

Figure 7:
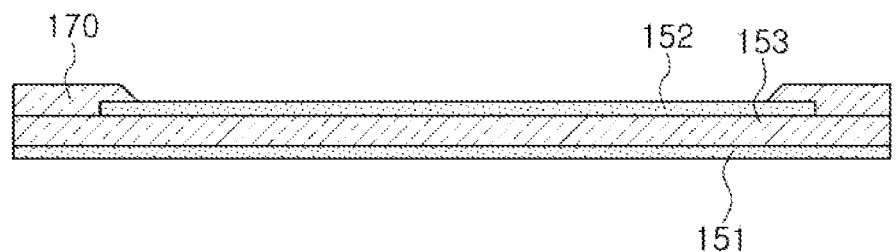

As illustrated in FIG. 7, the mask layer 160 is selectively removed through delamination, dissolution, etching, or other suitable removal measures.

Thus, a middle region of the resonating portion 150 is configured in a sandwich form in which the piezoelectric layer 153 is disposed between the first and second electrodes 151 and 152, and the frame 170 is completed in the vicinity of the outer lateral end portions of the second electrode.

Figure 8:
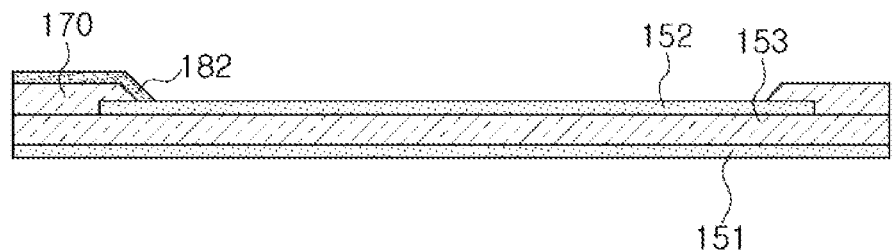

Then, a first connection portion and a second connection portion 182 are formed to provide external electrical connection to the first electrode 151 and the second electrode 152, respectively. As illustrated in FIG. 8, the second connection portion 182 is formed on a portion of the frame 170 to be extended externally from the resonating portion.

The first connection portion and the second connection portion 182 are formed of, for example, a metal such as gold (Au), copper (Cu), or other suitable conductor.

Characteristics of the resonating portion 150 (see FIG. 1) or a filter are confirmed using the connection portions to perform frequency trimming and then form the air gap 130 (see FIG. 1).

The air gap 130 is formed by removing the sacrificial layer as described above. For example, when the sacrificial layer is formed of polysilicon, the sacrificial layer may be removed using etching gas, but is not limited thereto.

As such, in forming the air gap 130 by etching the sacrificial layer, when the membrane layer 140 (see FIG. 1) is formed of a plurality of membrane layers, a second membrane 142 formed on a first membrane 141 serves as an etch stop layer, to thus protect the first electrode 151 or the piezoelectric layer 153 formed thereon.

As described above, according to embodiments, by disposing a frame on a resonator, a quality factor may be increased and insertion loss may be reduced. Further, a change in linearity, an inclination, or dimensions caused in forming a frame according to related art may be significantly reduced. In addition, residuals such as protrusions, which may adversely affect performance, are removed.

Thus, a height and width of a frame formed on a resonator, an angle of an inclined surface thereof, and the like may be controlled, to implement precise dimensions. In detail, an increase in resonator characteristics, for example, a quality factor and the like, by a frame is reproducibly substantially uniform, and thus, a constant and precise kt2 (Electro-mechanical Coupling Coefficient) value and bandwidth may be obtained.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A resonator, comprising:
   a resonating portion comprising a first electrode, a second electrode, and a piezoelectric layer disposed between the first electrode and the second electrode;
   a frame provided at an outer edge of the resonating portion, a portion of the frame covering an outer end portion of the second electrode; and
   a connection portion disposed on an upper surface of the frame.

2. The resonator of claim 1, further comprising:
   a substrate positioned to oppose the frame provided on the resonating portion,
   wherein an air gap is formed between the substrate and the resonating portion.

3. The resonator of claim 2, wherein a membrane layer is positioned between the substrate and the resonating portion.

4. The resonator of claim 1, wherein the outer end portion of the second electrode is embedded between the frame and the piezoelectric layer without being externally exposed.

5. The resonator of claim 1, wherein the frame is formed using a same material as a material of the piezoelectric layer.

6. The resonator of claim 1, wherein the frame is formed using a metal different from a material of the second electrode.

7. The resonator of claim 1, wherein a material of the frame has higher etching selectivity than etching selectivity of a material of the second electrode.

8. The resonator of claim 1, wherein the second electrode is embedded between the frame and the piezoelectric layer.

9. The resonator of claim 1, wherein the connection portion is configured to overlap the outer end portion of the second electrode.

10. The resonator of claim 1, wherein the connection portion is configured to extend externally from the second electrode.

11. The resonator of claim 1, wherein the second electrode is connected to the connection portion.

12. A resonator, comprising:
    a piezoelectric layer;
    an electrode positioned on the piezoelectric layer;
    a frame extending from the piezoelectric layer to cover a peripheral end portion of the electrode; and
    a connection portion disposed on an upper surface of the frame.

13. The resonator of claim 12, wherein a portion of the electrode is retained between the frame and the piezoelectric layer.

14. The resonator of claim 13, wherein an outer periphery of the electrode is secured against the piezoelectric layer by the frame, wherein the frame slopes downwards to the electrode.

* * * * *